(12) United States Patent
Kuo

(10) Patent No.: US 11,393,957 B2
(45) Date of Patent: Jul. 19, 2022

(54) ELECTRONIC DEVICE

(71) Applicant: Innolux Corporation, Miao-Li County (TW)

(72) Inventor: Shu-Ming Kuo, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 0 days.

(21) Appl. No.: 16/932,815

(22) Filed: Jul. 19, 2020

(65) Prior Publication Data
US 2021/0057616 A1    Feb. 25, 2021

(30) Foreign Application Priority Data
Aug. 20, 2019    (CN) .......................... 201910767880.8

(51) Int. Cl.
*H01L 33/50* (2010.01)
*H01L 25/075* (2006.01)
*H01L 33/62* (2010.01)

(52) U.S. Cl.
CPC ........ *H01L 33/508* (2013.01); *H01L 25/0753* (2013.01); *H01L 33/62* (2013.01); *H01L 2933/0041* (2013.01)

(58) Field of Classification Search
CPC ... H01L 33/508; H01L 25/0753; H01L 33/62; H01L 2933/0041; H01L 33/505; H01L 33/501; H01L 33/50; H01L 51/5237; H01L 51/5262
See application file for complete search history.

(56) References Cited

U.S. PATENT DOCUMENTS

| 2013/0062648 | A1* | 3/2013 | Nishimura | H01L 33/504 257/E33.061 |
|---|---|---|---|---|
| 2017/0054053 | A1* | 2/2017 | Jeon | H01L 25/0753 |
| 2017/0365747 | A1* | 12/2017 | Basin | H01L 25/0753 |
| 2018/0011231 | A1* | 1/2018 | Jiang | G02F 1/133514 |
| 2018/0371315 | A1* | 12/2018 | Hofmann | H01L 33/507 |
| 2019/0067533 | A1* | 2/2019 | Chen | H01L 33/508 |
| 2019/0206954 | A1* | 7/2019 | Chang | H01L 27/3241 |
| 2019/0293842 | A1* | 9/2019 | Chen | G02B 1/005 |
| 2019/0348575 | A1* | 11/2019 | Lai | H01L 33/502 |
| 2020/0035870 | A1* | 1/2020 | Estrada | H01L 33/502 |

(Continued)

FOREIGN PATENT DOCUMENTS

| CN | 103733244 | 4/2014 |
|---|---|---|
| CN | 109830186 | 5/2019 |

(Continued)

OTHER PUBLICATIONS

"Office Action of China Counterpart Application", datedd Jun. 21, 2021, p. 1-p. 7.

(Continued)

*Primary Examiner* — Victor A Mandala
(74) *Attorney, Agent, or Firm* — JCIPRNET

(57) ABSTRACT

An electronic device including a first substrate, an isolating layer, a porous structure, and a light conversion unit is provided. The isolating layer is disposed on the first substrate and has an opening. The porous structure is disposed in the opening and has a plurality of pores arranged irregularly. The light conversion unit is disposed in the pores of the porous structure. The electronic device of the disclosure has ideal quality.

20 Claims, 8 Drawing Sheets

(56) References Cited

U.S. PATENT DOCUMENTS

| | | | | |
|---|---|---|---|---|
| 2020/0258944 A1* | 8/2020 | Joo | ...................... | H01L 27/322 |
| 2020/0295239 A1* | 9/2020 | Song | ..................... | H01L 33/504 |
| 2021/0028327 A1* | 1/2021 | Lin | .................... | H01L 33/0095 |

FOREIGN PATENT DOCUMENTS

| | | | |
|---|---|---|---|
| DE | 102016106841 | | 3/2017 |
| KR | 20130010404 | | 1/2013 |
| KR | 10-2013-0010404 | * | 2/2013 |

OTHER PUBLICATIONS

"Search Report of Europe Counterpart Application", dated Dec. 17, 2020, p. 1-p. 10.

* cited by examiner

ELECTRONIC DEVICE

CROSS-REFERENCE TO RELATED APPLICATION

This application claims the priority benefit of China patent application serial no. 201910767880.8, filed on Aug. 20, 2019. The entirety of the above-mentioned patent application is hereby incorporated by reference herein and made a part of this specification.

BACKGROUND

Technical Field

The disclosure relates to an electronic device, and particularly relates to an electronic device having a light conversion unit.

Description of Related Art

With the rapid development of electronic products, there are more and more demands for electronic devices. In order to improve the quality of the electronic devices, materials with improved light conversion functions have been continuously introduced into the electronic devices.

SUMMARY

The disclosure is directed to an electronic device which has a light conversion unit and can provide improved light output effect.

An embodiment of the disclosure provides an electronic device including a first substrate, an isolating layer, a porous structure, and a light conversion unit. The isolating layer is disposed on the first substrate and has an opening. The porous structure is disposed in the opening and has a plurality of pores arranged irregularly. The light conversion unit is disposed in the pores of the porous structure.

An embodiment of the disclosure provides an electronic device including a substrate, a light conversion layer and a light-emitting unit. The light conversion layer is disposed on the substrate, and the light conversion layer includes a porous structure and a light conversion unit, where the porous structure has a plurality of pores, and the light conversion unit is dispersed in the pores. The light-emitting unit is disposed between the light conversion layer and the substrate.

Based on the above descriptions, in the electronic device of the disclosure, the light conversion unit is disposed in the porous structure, by which the light conversion unit may provide improved light conversion properties to improve the quality of the electronic device.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
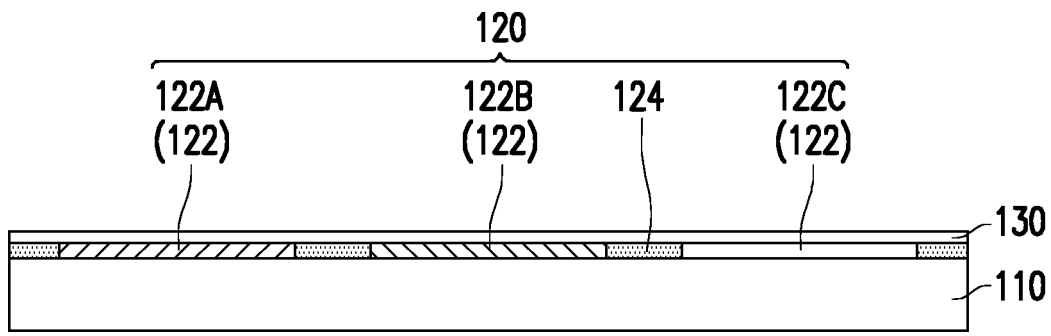
FIG. 1A to FIG. 1H are schematic diagrams of a partial manufacturing process of an electronic device according to an embodiment of the disclosure.

In the disclosure, a situation that one structure (or layer, component, substrate) is located on another structure (layer, component, substrate) may refer to that the two structures are located adjacent to each other and in direct connection, or refer to that the two structures are adjacent to each other but in indirect connection, and the indirect connection refers to that there is at least one intermediate structure (or intermediate layer, intermediate component, intermediate substrate, intermediate interval) between the two structures, where a lower surface of one structure is adjacent to or directly connected to an upper surface of the intermediate structure, and an upper surface of the other structure is adjacent to or directly connected to a lower surface of the intermediate structure, and the intermediate structure may be composed of a single-layer or multi-layer solid structure or non-solid structure, which is not limited by the disclosure.

Electrical connections or couplings described in the disclosure may all refer to direct connections or indirect connections. In the case of the direct connection, terminals of components on two circuits are directly connected or connected to each other by a conductive line. In the case of the indirect connection, there are other components between the terminals of the components on the two circuits, such as switches, diodes, capacitors, inductors, resistors, other suitable components, or a combination of the above components.

In the disclosure, thicknesses, lengths, and widths may be measured by using an optical microscope or obtained from an image measured by an electron microscope, but the disclosure is not limited thereto. Moreover, the terms "about", "approximately", and "mostly" generally indicate to be within a range of 20%, or a range of 10%, or a range of 5%, or a range of 3%, or a range of 2%, or a range of 1%, or a range of 0.5% of a given value. A given quantity is an approximate quantity, i.e., the meanings of "about", "approximately", and "mostly" may still be implied without specifying "about", "approximately" and "mostly".

Reference will now be made in detail to the present embodiments of the disclosure, examples of which are illustrated in the accompanying drawings. Wherever possible, the same reference numbers are used in the drawings and the description to refer to the same or like parts.

FIG. 1A to FIG. 1H are schematic diagrams of a partial manufacturing process of an electronic device according to an embodiment of the disclosure. In FIG. 1A, a color filter (CF) unit 120 and a low refractive index layer 130 are disposed on a first substrate 110. The first substrate 110 may be a rigid substrate or a flexible substrate, such as a transparent plastic substrate or a glass substrate. For example, a material of the first substrate 110 includes glass, quartz, sapphire, ceramic, polycarbonate (PC), polyimide (PI), and polyethylene terephthalate (PET), rubber, fiberglass, other suitable substrate materials, or a combination of the above materials, but the disclosure is not limited thereto. The color filter unit 120 may include a plurality of color filter patterns 122 and a black matrix (BM) 124. The black matrix 124 is a grid pattern with openings, and the color filter patterns 122 are respectively filled in the openings of the grid pattern. The color filter patterns 122 may include a red filter pattern 122A, a green filter pattern 122B, and a blue filter pattern 122C, but the disclosure is not limited thereto. The low refractive index layer 130 may cover the color filter unit 120, such that the color filter unit 120 is located between the first substrate 110 and the low refractive index layer 130. The low refractive index layer 130 may improve a light utilization rate, and a range of a refractive index thereof may be, for example, 1 to 1.45 (1<refractive index≤1.45), or 1.15 to 1.4 (1.15≤refractive index≤1.4), and a material of the low refractive index layer 130 may include, for example, a polymer mixture containing silicon beads, but the disclosure is not limited thereto. A thickness of the low refractive index layer 130 may be about 50 nanometers (nm) to 200 nm (50 nm≤thickness≤200 nm), but the disclosure is not limited thereto. In some embodiments, the thickness of the low refractive index layer 130 may be the maximum thickness of the low refractive index layer 130 in a normal direction of the first substrate 110 in a partial cross-sectional view of the electronic device. In other embodiments, the low refractive index layer 130 may be selectively omitted or only corresponds to a part of the color filter patterns 122.

Figure 1B:
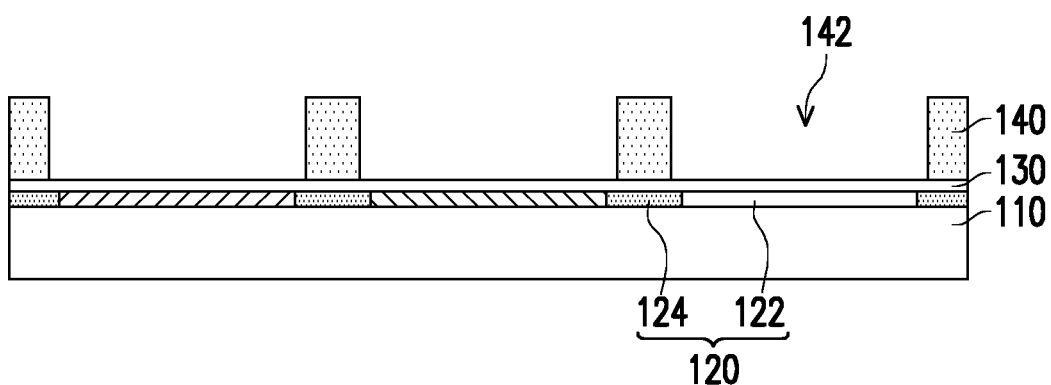

In FIG. 1B, an isolating layer 140 is further formed on the first substrate 110. The isolating layer 140 has openings 142, where the isolating layer 140 may be overlapped with the black matrix 124 in the normal direction of the first substrate 110, and the opening 142 of the isolating layer 140 may correspond to one of the color filter patterns 122. A thickness of the isolating layer 140 may be from 1 micrometer (micrometer, μm) to 100 μm (1 μm≤thickness≤100 μm). In some embodiments, the thickness of the isolating layer 140 may be the maximum thickness of the isolating layer 140 in the normal direction of the first substrate 110 in a partial cross-sectional view of the electronic device. In some embodiments, a width of the isolating layer 140 may be less than or equal to a width of the black matrix 124, but the disclosure is not limited thereto. In some embodiments, the width of the isolating layer 140 (or the black matrix 124) may be the maximum width of the isolating layer 140 (or the black matrix 124) in a direction perpendicular to the normal direction of the first substrate 110 in a partial cross-sectional view of the electronic device, or may be the maximum width of the isolating layer 140 (or the black matrix 124) in a direction perpendicular to a partial extending direction of the isolating layer 140 (or the black matrix 124) in a partial top view of the electronic device. Moreover, the isolating layer 140 may have a function of reducing light penetration, and an optical density (an OD value) thereof is, for example, greater than 2, but the disclosure is not limited thereto. In some embodiments, the isolating layer 140 may have a reflection property, and for example, has a white color. Therefore, the isolating layer 140 may reflect light to improve a light utilization rate. In other embodiments, the isolating layer 140 may have a black color or other colors, but the disclosure it is not limited thereto.

Figure 1C:
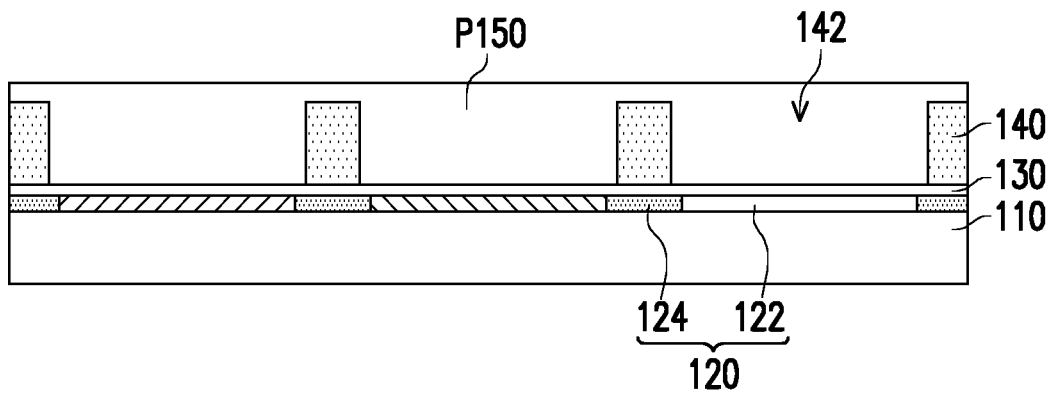
Figure 1D:
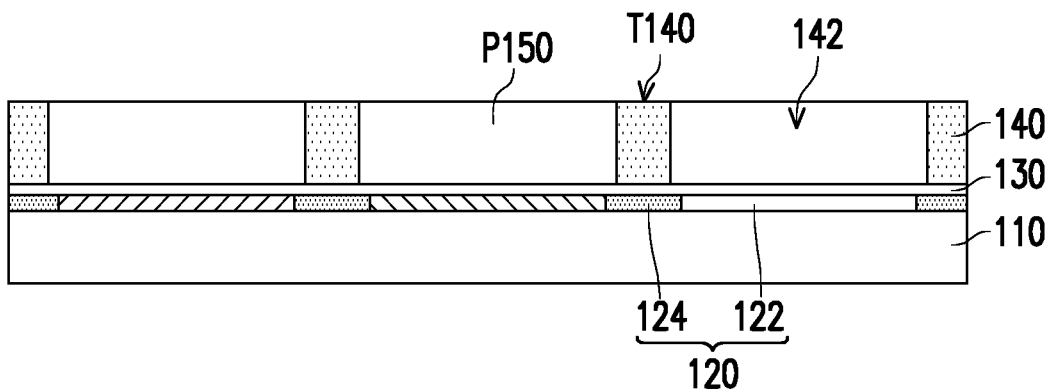

In FIG. 1C, a preposed material P150 is coated on the first substrate 110. The preposed material P150 may be filled in the openings 142, and a thickness of the preposed material P150 may be equal to or slightly higher than the thickness of the isolating layer 140, but the disclosure is not limited thereto. The preposed material P150, for example, includes a polymer material, inorganic nanoparticles and a solvent, where the polymer material, for example, includes polyimide (PI), polymethylmethacrylate (PMMA), epoxy resin, etc., but the disclosure is not limited thereto. After the preposed material P150 is coated, a yellow light process or a dry etching process may be selectively performed to remove the preposed material P150 exceeding a top surface T140 of the isolating layer 140, as shown in FIG. 1D. In this way, the top surface T140 of the isolating layer 140 may be exposed, and substantially no preposed material P150 is left on the top surface T140 of the isolating layer 140. Namely, the preposed materials P150 in the openings 142 are not connected to each other. In some embodiments, in the step of removing the preposed material P150 exceeding the top surface T140 of the isolating layer 140, a part of the isolating layer 140 is possibly removed, so that an overall thickness of the isolating layer 140 may be slightly reduced. It should be noted that in some embodiments, before the preposed material 150 is coated, the isolating layer 140 may be subjected to a hydrophobic treatment. For example, plasma is adopted to increase a water contact angle of the surface of the isolating layer 140 to reduce possibility that a part of solvent may overflow in subsequent processes. In some embodiments, the isolating layer 140 is not subjected to the hydrophobic treatment.

Figure 1E:
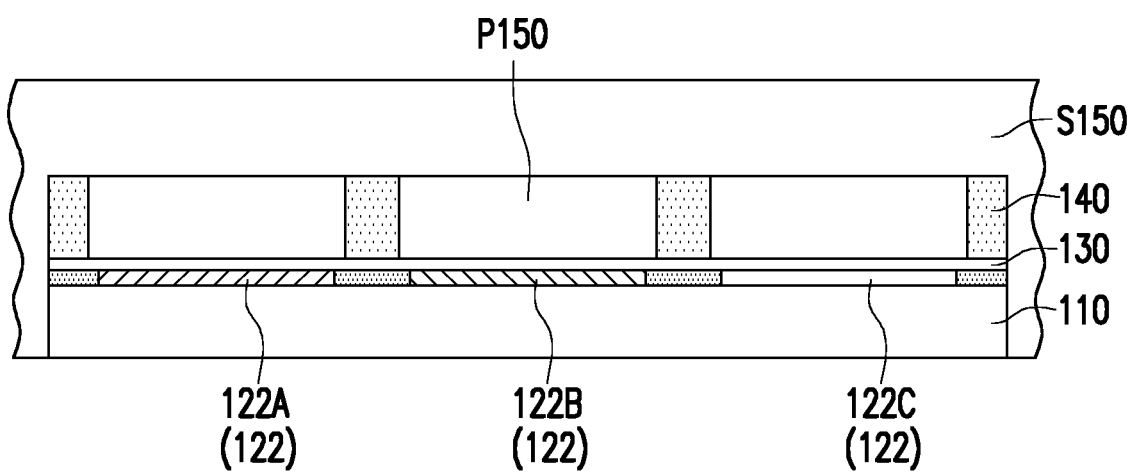

In FIG. 1E, the first substrate 110 configured with the preposed material P150 may be placed in a replacement solvent 5150, and the replacement solvent 5150 may be used to replace at least a part of the original ingredients in the preposed material P150. Then, in FIG. 1F, the preposed material P150 containing the replacement solvent 5150 in FIG. 1E may be dried to form a porous structure 150. The porous structure 150 has a plurality of pores V, and the porosity of the porous structure 150 may be 20% to 80%. A pore size of the pores V may be about 0.05 μm to 10 μm, but the disclosure is not limited thereto. The porosity of the porous structure 150 may be measured in a desorption manner, or may also be measured in other manners known in the art. The pore size of the pores V may be obtained by measuring the maximum width of one of the pores V in a cross-sectional view or a top view of a local area, but the disclosure is not limited thereto. Moreover, since the preposed material P150 exceeding the top surface T140 of the isolating layer 140 has been removed during the preceding process of the proposed material P150, a thickness of the final porous structure 150 may be slightly smaller than or substantially equal to the isolating layer 140. Namely, the thickness of the porous structure 150 may be greater than or equal to 1 μm and smaller than or equal to 100 μm (1 μm≤thickness≤100 μm).

Figure 1F:
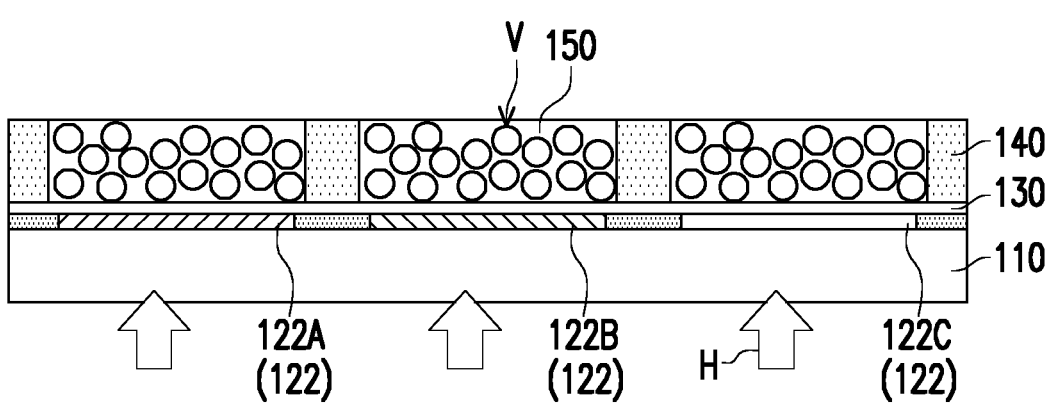

In the embodiment, a heating step may be adopted to volatilize the replacement solvent 5150 in the preposed material P150 to obtain the final porous structure 150. The heating step may include applying heat H to the laminated structure by using a heating plate or an oven. Moreover, the replacement solvent 5150 used in FIG. 1E is, for example, a solvent with better volatility, a foaming agent, etc. Therefore, in the process of volatilizing the replacement solvent 5150, the pores V may be generated due to volatilization or expansion of the polymer material in the preposed material P150, thereby forming the porous structure 150. The pores V may present an irregular distribution, but the disclosure is not limited thereto. In other embodiments, the preposed material P150 itself may include high volatility ingredients and low volatility ingredients, and in the process of producing the porous structure 150 from the preposed material P150, it is unnecessary to perform the step of FIG. 1E. Namely, in the embodiment, after the step of coating the preposed material P150, the heating step of FIG. 1F may be directly performed to obtain the porous structure 150. Even, in other embodiments, the removing step of FIG. 1D may also be omitted, so that after the step of coating the preposed material P150 of FIG. 1C, the heating step of FIG. 1F is performed to obtain the porous structure 150.

Figure 1G:
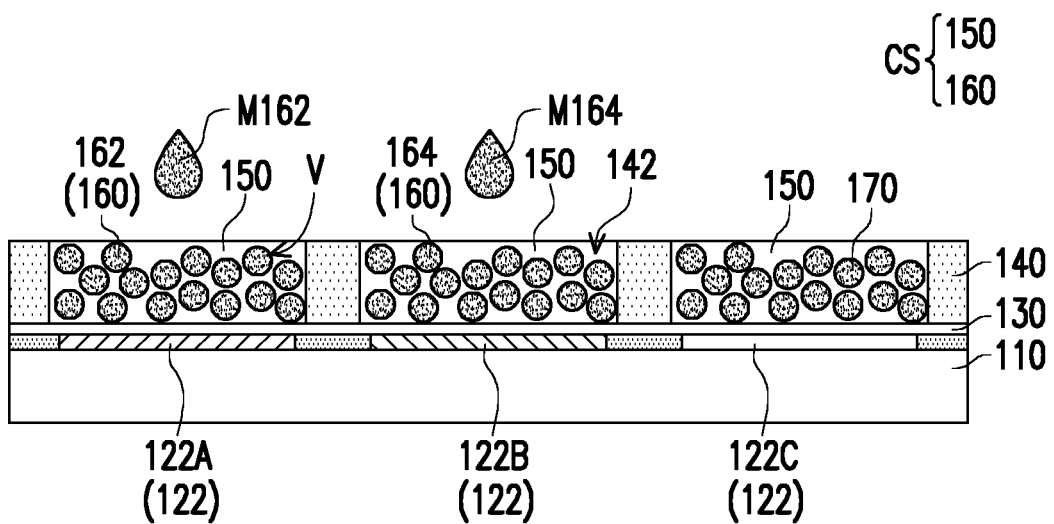

In FIG. 1G, light conversion materials M162 and M164 are filled in the porous structure 150. In the embodiment, a method of filling the light conversion materials M162 and M164 in the porous structure 150 includes, for example, an inkjet method, a dripping method, or other suitable methods. In the embodiment, after filling the light conversion materials M162 and M164 in the porous structure 150 by using the inkjet method, the light conversion materials M162 and M164 may be adsorbed in the pores V of the porous structure 150 to form a light conversion unit 160. In this way, the light conversion unit 160 may be dispersed in the porous structure 150 to form a light conversion layer CS.

The light conversion materials M162 and M164 may include, for example, a quantum dot material, such as a cadmium selenide (CdSe) series, an indium phosphide (InP) series, etc., but the disclosure is not limited thereto. Since the pores V in the porous structure 150 are substantially dispersed throughout the porous structure 150, the light conversion materials M162 and M164 may be filled into the pores V through capillary adsorption. Therefore, the light conversion unit 160 in the light conversion layer CS may be dispersed in the porous structure 150 and has, for example, uniform distribution.

Moreover, the light conversion materials M162 and M164 filled in different openings 142 may have different wavelength conversion ranges. To be specific, the wavelength conversion ranges of the light conversion units 160 in the openings 142 may respectively correspond to the colors of the color filter patterns 122 disposed between the light conversion units 160 and the first substrate 110. For example, the color filter pattern 122 includes a red filter pattern 122A, a green filter pattern 122B, and a blue filter pattern 122C. An excitation wavelength of a light conversion unit 162 corresponding to the red filter pattern 122A may be, for example, in a red wavelength range, and an excitation wavelength of a light conversion unit 164 corresponding to the green filter pattern 122B may be, for example, in a green wavelength range. Moreover, the porous structure 150 corresponding to the blue filter pattern 122C may be selectively filled with no material, filled with a wavelength conversion material, or filled with a filling material 170 without a wavelength conversion property. In some embodiments, the filling material 170 may be transparent adhesive, or may include scattering particles, or other transparent materials. After being converted by the light conversion unit 162, a proportion of light in a short wavelength range (close to a blue wavelength range) that is incident to the red filter pattern 122A is reduced, while a proportion of light in a long wavelength range (close to a red wavelength range) is increased, which improves the purity or the brightness of red light. Similarly, after being converted by the light conversion unit 164, a proportion of light in the short wavelength range (close to the blue wavelength range) that is incident to the green filter pattern 122B is reduced, while a proportion of light in the long wavelength range (close to a green wavelength range) is increased, which improves the purity or the brightness of green light. Moreover, when the porous structure 150 corresponding to the blue filter pattern 122C is filled with the filling material 170 without the wavelength conversion property, light may remain blue after passing through the filling material 170 and the blue filter pattern 122C. In this embodiment, the overall color performance of the electronic device may be improved.

Figure 1H:
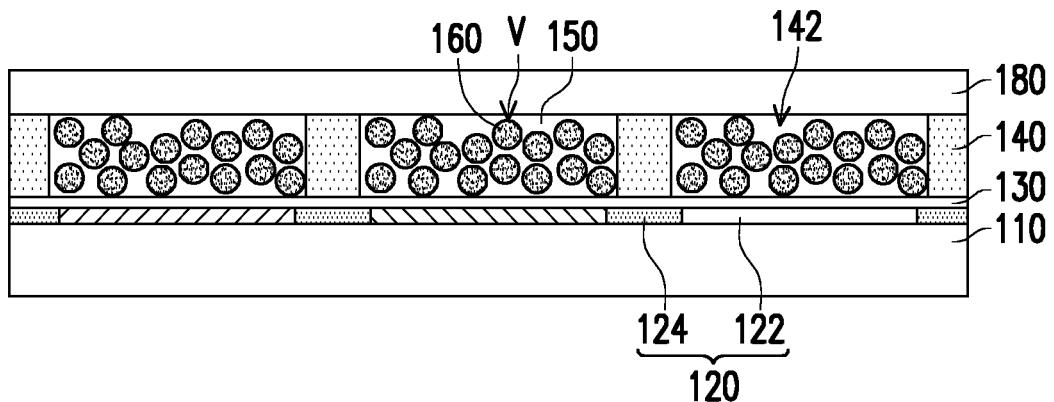

In FIG. 1H, a protective layer 180 may be further formed on the first substrate 110. The protective layer 180 may reduce entry of moisture and/or oxygen to mitigate damaging the light conversion unit 160 in the light conversion layer CS. The protective layer 180 may be a coating-type moisture barrier layer, or may be a multilayer structure formed by alternately stacking organic layers and inorganic layers, but the disclosure is not limited thereto. A material of the coating-type moisture barrier layer includes, for example, siloxane, but the disclosure is not limited thereto. In addition, in some embodiments, the protective layer 180 may have a low refractive index, for example, the refractive index is in a range of 1.1 to 1.4 (1.1≤refractive index≤1.4), but the disclosure is not limited thereto.

According to FIG. 1H, it is known that the isolating layer 140 is disposed on the first substrate 110, and the isolating layer 140 has an opening 142. The porous structure 150 is disposed in the opening 142, and the porous structure 150 has a plurality of pores V arranged irregularly. The light conversion unit 160 is disposed in the pores V of the porous structure 150. The color filter unit 120 is disposed between the first substrate 110 and the porous structure 150. The low refractive index layer 130 is disposed between the color filter unit 120 and the porous structure 150. The protective layer 180 is disposed on the porous structure 150. In some embodiments, the structure of FIG. 1H may be regarded as a color filter substrate, and when it is actually applied to an electronic device, the color filter substrate of FIG. 1H may be attached to another substrate (a second substrate), and light-emitting units or a display medium may be disposed between the color filter substrate and the another substrate to constitute a display panel of a display device or the electronic device.

Figure 1I:
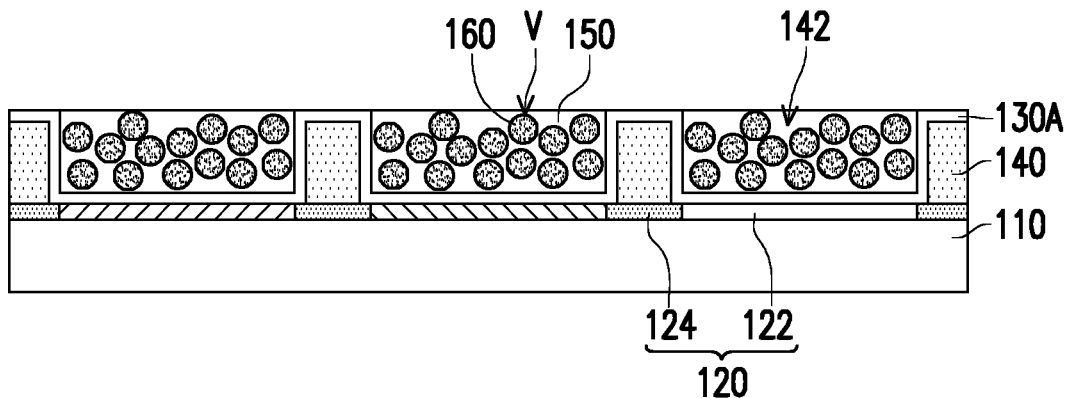
FIG. 1I is a schematic diagram of a part of components of an electronic device according to another embodiment of the disclosure.

FIG. 1I is a schematic diagram of a part of components of an electronic device according to another embodiment of the disclosure. The components shown in FIG. 1G are substantially similar to the components in FIG. 1H, and description of the aforementioned embodiment may be referred for manufacturing methods, materials, structures, and properties of the components in FIG. 1I, and details thereof are not repeated.

A main difference between the embodiment and the aforementioned embodiment is that the manufacturing step of the low refractive index layer 130A of the embodiment is carried out after the isolating layer 140 is manufactured, so that the low refractive index layer 130A covers the color filter unit 120 and the isolating layer 140. In this way, a side surface and a top surface of the isolating layer 140 may be covered by the low refractive index layer 130A. However, in other embodiments, the low refractive index layer 130A on the top surface of the isolating layer 140 may be partially or completely removed. In addition, the porous structure 150 in one of the openings 142 of the isolating layer 140 may be selectively filled with a material without the light conversion property, such as the filling material 170 shown in FIG. 1G.

Figure 2A:
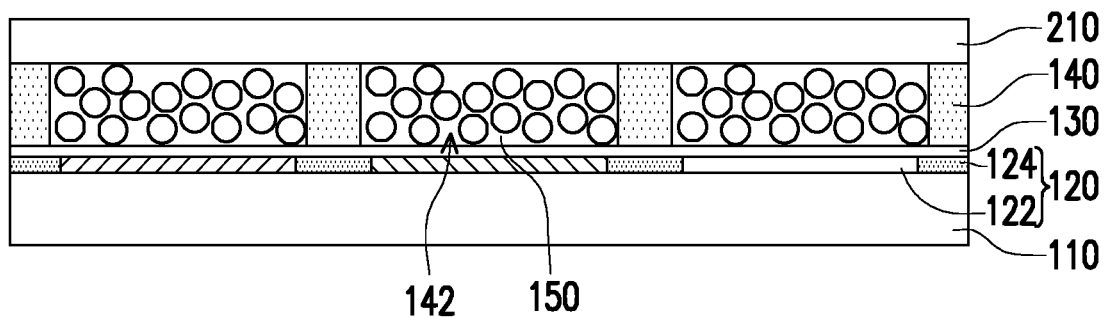
FIG. 2A to FIG. 2E are schematic diagrams of a partial manufacturing process of an electronic device according to another embodiment of the disclosure.

FIG. 2A to FIG. 2E are schematic diagrams of a partial manufacturing process of an electronic device according to another embodiment of the disclosure. The step of FIG. 2A may be performed after the step of FIG. 1F, so that a structure shown in FIG. 2A is substantially similar to the structure of FIG. 1F. In FIG. 2A, the color filter unit 120, the low refractive index layer 130, the isolating layer 140, the porous structure 150, and a cover layer 210 are disposed on the first substrate 110. To be specific, in the embodiment, for example, after performing the step of FIG. 1F, the cover layer 210 is formed on the first substrate 110. The cover layer 210 is, for example, a film layer that may cover the isolating layer 140 and the porous structure 150.

Figure 2B:
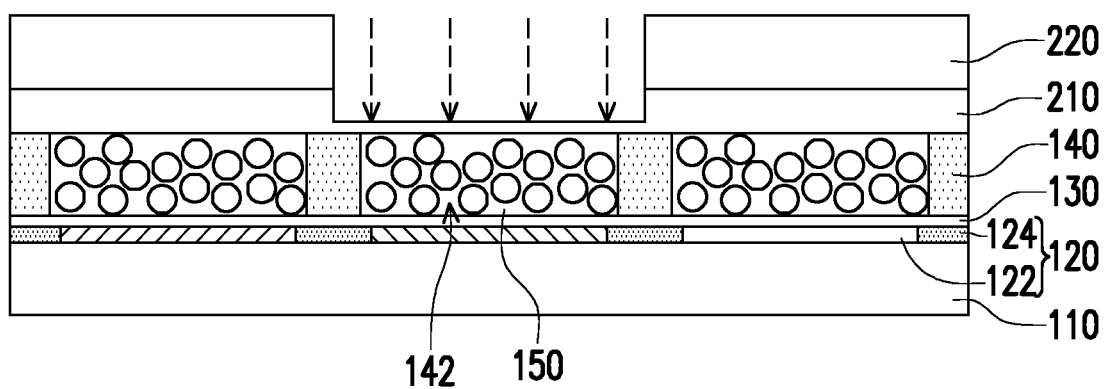
Figure 2C:
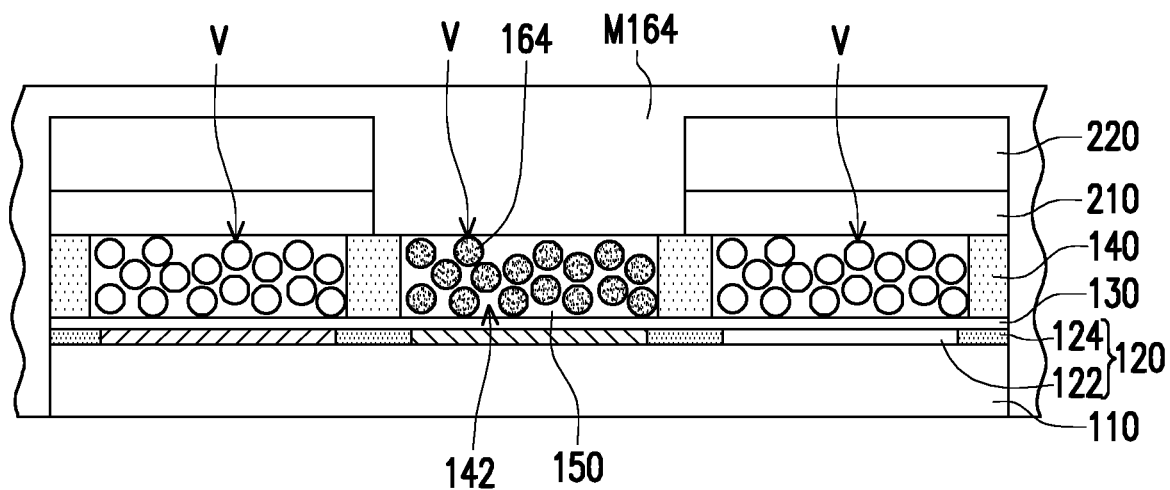

In FIG. 2B, a first patterned photoresist 220 is formed on the cover layer 210, and the first patterned photoresist 220 is taken as a mask to remove a part of the cover layer 210. The removing step shown in FIG. 2B may partially remove the cover layer 210 until the porous structure 150 in one of the openings 142 is exposed. Then, in FIG. 2C, the porous structure 150 in one of the openings 142 is not covered by the cover layer 210, and the first substrate 110 and the color filter unit 120, the low refractive index layer 130, the isolating layer 140, the porous structure 150, the cover layer 210, and the first patterned photoresist 220 on the first substrate 110 are placed in the solution of the light conversion material M164, and the light conversion material M164 is adsorbed in the pores V of the porous structure 150 to form the light conversion unit 164 in the pores V of the porous structure 150.

Figure 2D:
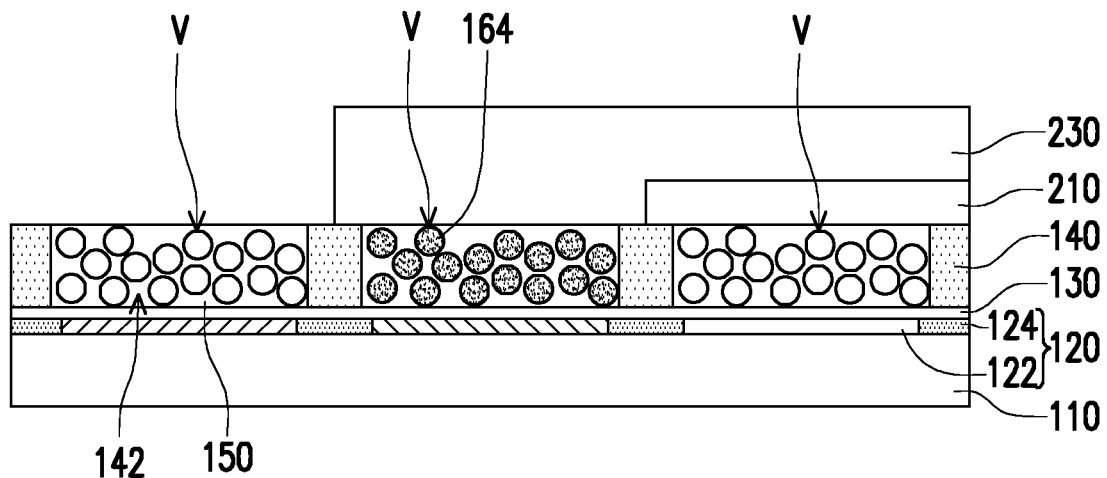
Figure 2E:
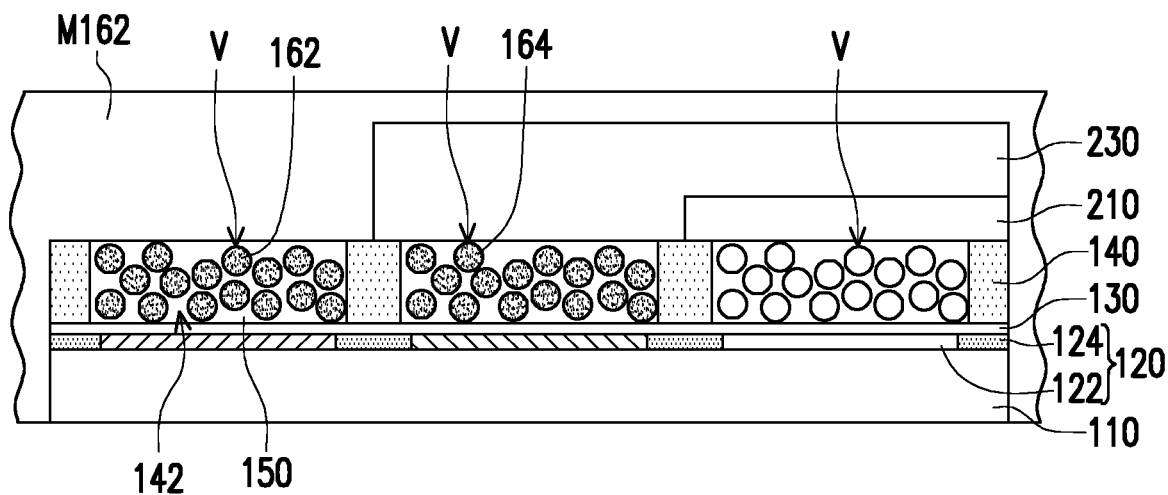

Then, as shown in FIG. 2D, a second patterned photoresist 230 is formed on the first substrate 110, and the second patterned photoresist 230 is taken as a mask to remove the cover layer 210 over the other opening 142. Before the second patterned photoresist 230 is formed, the first patterned photoresist 220 may be selectively stripped, but the disclosure is not limited thereto. Moreover, the second patterned photoresist 230 covers the porous structure 150 configured with the light conversion unit 164 and exposes the porous structure 150 in the other opening 142. Then, in FIG. 2E, the first substrate 110 and the color filter unit 120, the low refractive index layer 130, the isolating layer 140, the porous structure 150, the cover layer 210, and the second patterned photoresist 230 on the first substrate 110 are placed into the solution of the light conversion material M162, and the light conversion material M162 is adsorbed in the pores V of the porous structure 150 to form the light conversion unit 162 in the pores V of the porous structure 150. As described in the aforementioned embodiment, the light conversion unit 162 and the light conversion unit 164 may have different wavelength conversion ranges. To be specific, a main difference between the embodiment and the aforementioned embodiment lies in the manufacturing method of the light conversion unit 160, but the method of making the light conversion materials M162 and M164 to be adsorbed on the pores V of the porous structure 150 is not limited to the aforementioned two methods. In other embodiments, other methods in the art that may make the light conversion materials M162 and M164 to be adsorbed on the pores V of the porous structure 150 may also be adopted to implement the disclosure.

Figure 3:
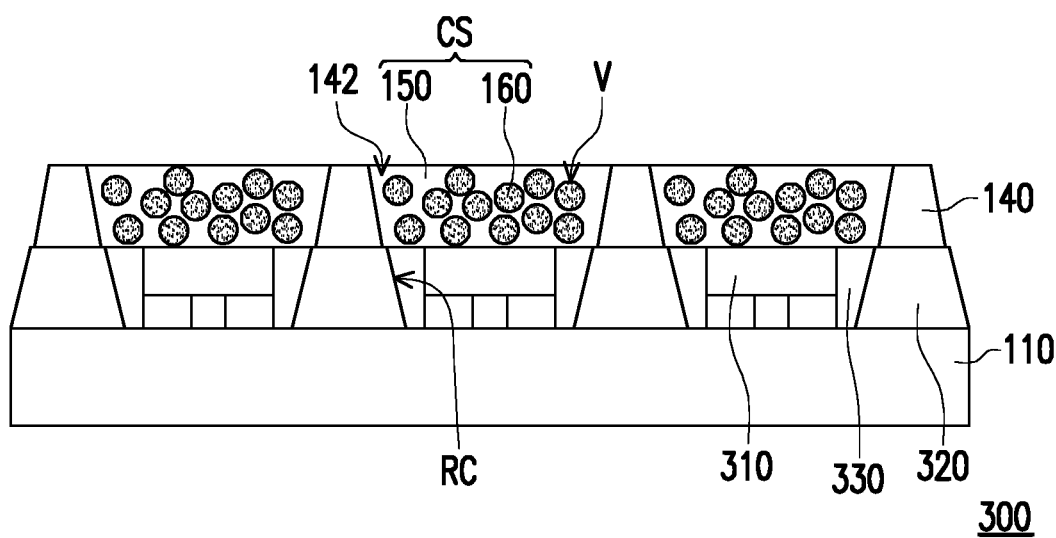
FIG. 3 is a structural schematic diagram of an electronic device according to an embodiment of the disclosure.

FIG. 3 is a structural schematic diagram of an electronic device according to an embodiment of the disclosure. Referring to FIG. 3, the electronic device 300 includes a first substrate 110, an isolating layer 140, a porous structure 150, a light conversion unit 160, a light-emitting unit 310, a spacing layer 320, and a filling layer 330. In the embodiment, the spacing layer 320 is disposed on the first substrate 110, and encircles at least a containing region RC. The light-emitting unit 310 is disposed on the first substrate 110 and is located in the containing region RC encircled by the spacing layer 320. In addition, the filling layer 330 is disposed in a space between the light-emitting unit 310 and the spacing layer 320 and/or a space between the light-emitting unit 310 and the first substrate 110. The isolating layer 140 is, for example, located on the spacing layer 320, and the isolating layer 140 may be overlapped with the spacing layer 320 in a normal direction of the first substrate 110. In other words, the opening 142 of the isolating layer 140 may correspond to the containing region RC of the spacing layer 320. The porous structure 150 has a plurality of pores V arranged irregularly, and the porous structure 150 is disposed in the opening 142 and located above the light-emitting unit 310. The light conversion unit 160 is disposed in the pores V of the porous structure 150 to constitute a light conversion layer CS. A main difference between the embodiment and the aforementioned embodiment is that in the embodiment, the light-emitting unit 310 is disposed between the light conversion layer CS and the first substrate 110. In the embodiment, the aforementioned embodiment may be referred for manufacturing methods of the isolating layer 140, the porous structure 150, and the light conversion unit 160, and details thereof are not repeated. In the disclosure, the light-emitting unit 310 may include an organic light-emitting diode (OLED), an inorganic LED, quantum dots, a fluorescent material, a phosphor material, other suitable materials, or a combination of the above materials, but the disclosure is not limited thereto. The inorganic LED may include a micro LED, a mini LED, or a quantum dot LED (QLED/QDLED), etc., but the disclosure is not limited thereto. The light-emitting unit 310 may, for example, emit light toward the light conversion layer CS. A wavelength range of the light emitted by the light-emitting unit 310 may be within an excitation wavelength range of the light conversion layer CS. The light emitted by the light-emitting unit 310 may be converted into light of another wavelength range for being emitted from the electronic device 300 after passing through the light conversion unit 160 in the light conversion layer CS.

Figure 4:
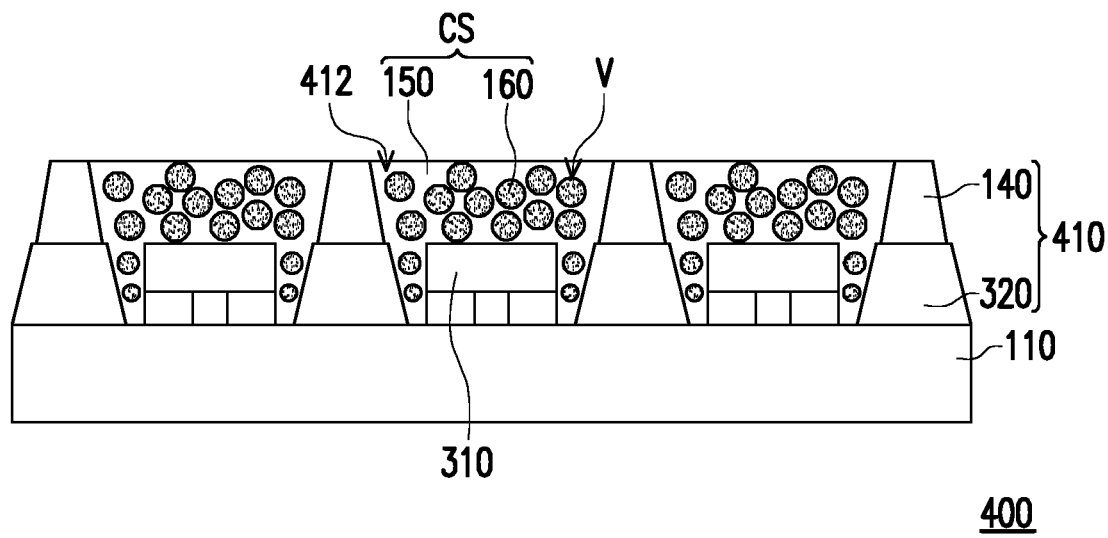
FIG. 4 is a structural schematic diagram of an electronic device according to another embodiment of the disclosure.

FIG. 4 is a structural schematic diagram of an electronic device according to another embodiment of the disclosure. Referring to FIG. 4, the electronic device 400 includes a first substrate 110, an isolating layer 140, a porous structure 150, a light conversion unit 160, a light-emitting unit 310, and a spacing layer 320. The spacing layer 320 is disposed on the first substrate 110, and the isolating layer 140 is disposed on the spacing layer 320 to form a double-layered integrated isolating layer 410, where the integrated isolating layer 410 has an opening 412. The porous structure 150 is disposed in the opening 412, and the porous structure 150 has a plurality of pores V arranged irregularly. The light conversion unit 160 is disposed in the pores V of the porous structure 150. In addition, the light-emitting unit 310 is also disposed in the opening 412, and the porous structure 150 is located on and beside the light-emitting unit 310. Namely, the porous structure 150 is disposed in a space between the light-emitting unit 310 and the spacing layer 320 and/or a space between the light-emitting unit 310 and the first substrate 110, and even contacts at least a part of a side surface of the light-emitting unit 310. It should be noted that the integrated isolating layer 410 of the embodiment may have a structure or shape of two or more layers according to an actual requirement.

Figure 5:
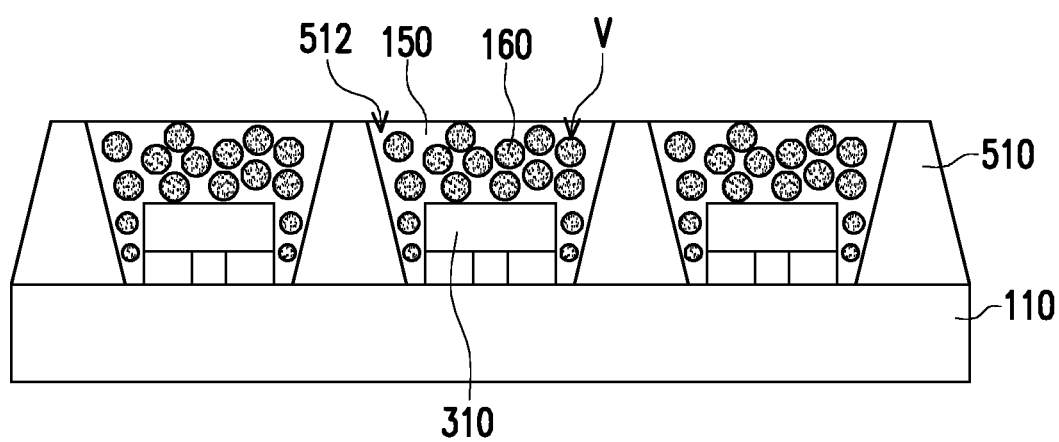
FIG. 5 is a structural schematic diagram of an electronic device according to still another embodiment of the disclosure.

FIG. 5 is a structural schematic diagram of an electronic device according to still another embodiment of the disclosure. Referring to FIG. 5, the electronic device 500 includes a first substrate 110, an isolating layer 510, a porous structure 150, a light conversion unit 160 and a light-emitting unit 310. In the embodiment, the isolating layer 510 is disposed on the first substrate 110 and has an opening 512. The light-emitting unit 310 is disposed on the first substrate 110 and is located in the opening 512. The porous structure 150 is also disposed on the first substrate 110 and is located in the opening 512. The porous structure 150 is a structure having a plurality of pores V arranged irregularly, and the light conversion unit 160 is disposed in the pores V of the porous structure 150. In the embodiment, the porous structure 150 and the light conversion unit 160 may be manufactured according to the manufacturing methods of the aforementioned embodiments, and details thereof are not repeated. In addition, the isolating layer 510 has an integrated structure, and may be used to replace the double-layered integrated isolating layer 410 in FIG. 4.

Figure 6:
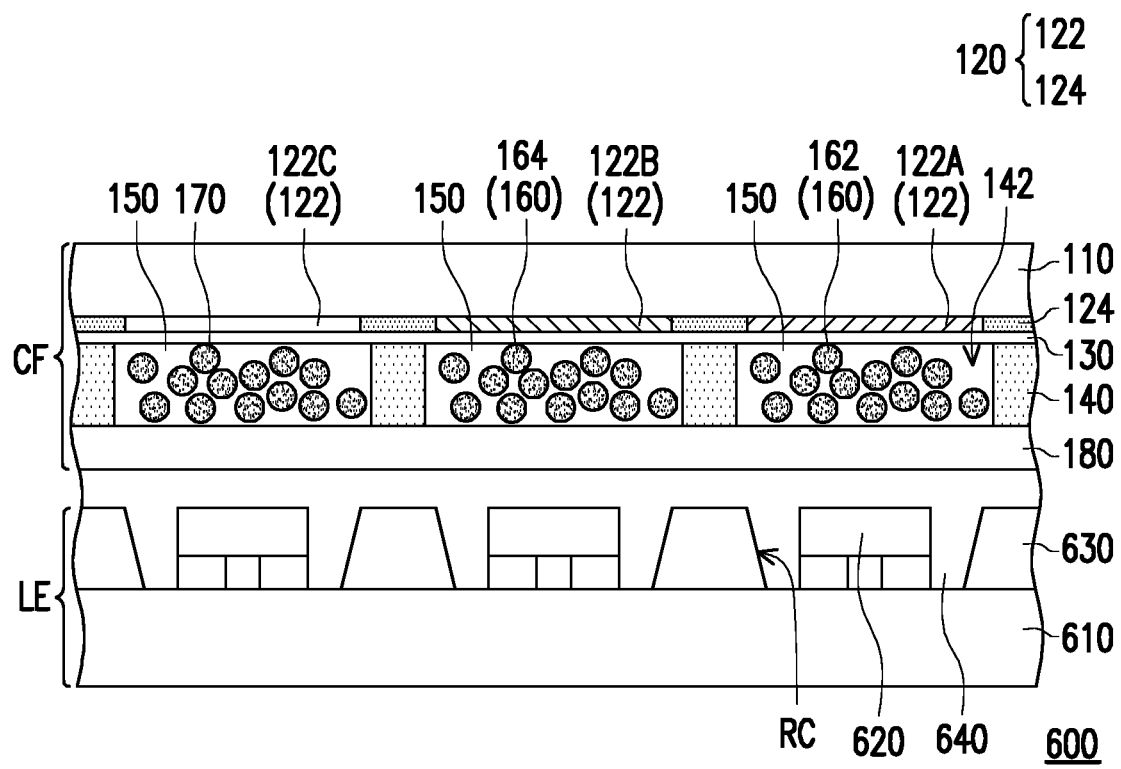
FIG. 6 is a structural schematic diagram of an electronic device according to yet another embodiment of the disclosure.

FIG. 6 is a structural schematic diagram of an electronic device according to yet another embodiment of the disclosure. Referring to FIG. 6, the electronic device 600 includes a first substrate 110, a color filter unit 120, a low refractive index layer 130, an isolating layer 140, a porous structure 150, a light conversion unit 160, a protective layer 180, a second substrate 610, a light-emitting unit 620, a spacing layer 630, an adhesive layer 640, etc. In the embodiment, the first substrate 110, the color filter unit 120, the low refractive index layer 130, the isolating layer 140, the porous structure 150, the light conversion unit 160, and the protective layer 180 may constitute a color filter substrate CF. The second substrate 610, the light-emitting unit 620, and the spacing layer 630 may constitute a light-emitting substrate LE. In addition, the color filter substrate CF may be attached to the light-emitting substrate LE through the adhesive layer 640, where the adhesive layer 640 may include optical adhesive (optical clear resin or optical clear adhesive), hydrogel, or other similar materials. It should be noted that although the adhesive layer 640 also contacts the light-emitting unit 620 in the embodiment shown in FIG. 6, in some embodiments, a material different from the adhesive layer 640 may also be adopted for the part located around the light-emitting unit 620 and in contact with the light-emitting unit 620.

In the embodiment, the color filter unit 120 includes color filter patterns 122 and a black matrix 124, and the light conversion unit 160 includes at least two different light conversion units 162 and 164. To be specific, the first substrate 110, the color filter unit 120, the low refractive index layer 130, the isolating layer 140, the porous structure 150, the light conversion unit 160, and the protective layer 180 are similar to the structure disclosed in the aforementioned FIG. 1H, so that description of the aforementioned embodiment may be referred for a stacking relationship, manufacturing methods and materials of the above components, and details thereof are not repeated. Wavelength conversion ranges of the light conversion units 162 and 164 are related to the corresponding color filter patterns 122. For example, the color filter pattern 122 corresponding to the light conversion unit 162 is, for example, a red filter pattern 122A, and the color filter pattern 122 corresponding to the light conversion unit 164 is, for example, a green filter pattern 122B, so that a light-emitting wavelength range of the excited light conversion unit 162 is, for example, within the red wavelength range, and a light-emitting wavelength range of the excited light conversion unit 164 is, for example, within the green wavelength range. In this way, after the conversion of the light conversion unit 162, a proportion of light in the short wavelength range (close to the blue wavelength range) that is incident to the red filter pattern 122A is reduced, while a proportion of light in the long wavelength range (close to the red wavelength range) is increased, which improves purity or brightness of red light. Similarly, after the conversion of the light conversion unit 164, a proportion of light in the short wavelength range (close to the blue wavelength range) that is incident to the green filter pattern 122B is reduced, while a proportion of light in the long wavelength range (close to the green wavelength range) is increased, which improves purity or brightness of green light. Moreover, the color filter pattern 122 may further include a blue filter pattern 122C, and the porous structure 150 corresponding to the blue filter pattern 122C may be selectively filled with no material, filled with a wavelength conversion material, or filled with a filling material 170 without a wavelength conversion property. For example, when the light-emitting unit 620 corresponding to the blue filter pattern 122C emits white light, the white light passes through the wavelength conversion material in the porous structure 150 and is converted into blue light, and then the blue light passes through the blue filter pattern 122C to improve the purity or brightness thereof; or when the light-emitting unit corresponding to the blue filter pattern 122C emits blue light, and the porous structure 150 is filled with the filling material 170 without the wavelength conversion property, the blue light may remain blue after passing through the filling material 170, and purity or brightness of the blue light may be increased after the blue light passes through the color filter pattern 122. In overall, through the aforementioned arrangement of the color filter pattern 122 and the light conversion unit 160, color performance of the electronic device 600 may be improved.

The light-emitting unit 620 and the spacing layer 630 are disposed on the second substrate 610. The spacing layer 630, for example, has a grid-like pattern, and encircles at least a containing region RC. The light-emitting unit 620 is located in the containing region RC encircled by the spacing layer 630. The adhesive layer 640 is disposed in a space between the light-emitting unit 620 and the spacing layer 630 and covers the spacing layer 630 to attach the first substrate 110 and the second substrate 610. A wavelength range of the light emitted by the light-emitting unit 620 may correspond to an excitation wavelength range of the light conversion unit 160. Therefore, the light emitted by the light-emitting unit 620 may be converted by the light conversion unit 160 and emitted out of the electronic device 600 in another wavelength range. In the embodiment, the light emitted by the light-emitting unit 620 is, for example, blue light, but the disclosure is not limited thereto. The light conversion unit 160 of the embodiment is dispersed in the pores V of the porous structure 150. Therefore, the light conversion unit 160 helps to improve quality or uniformity of the electronic device 600.

Figure 7:
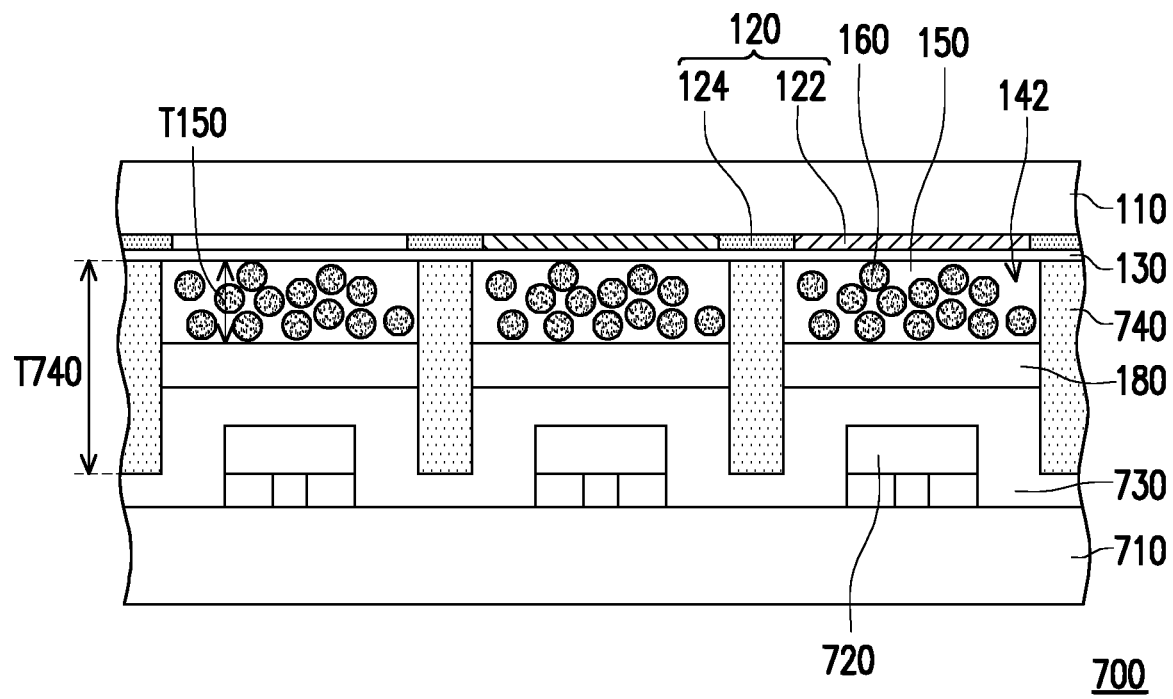
FIG. 7 is a structural schematic diagram of an electronic device according to still another embodiment of the disclosure.

FIG. 7 is a structural schematic diagram of an electronic device according to still another embodiment of the disclosure. In FIG. 7, the electronic device 700 includes a first substrate 110, a color filter unit 120 having color filter patterns 122 and a black matrix 124, a low refractive index layer 130, an isolating layer 740, a porous structure 150, a light conversion unit 160, a protective layer 180, a second substrate 710, a light-emitting unit 720, and an adhesive layer 730, where the aforementioned embodiments may be referred for relative configuration relationships, materials, manufacturing methods, etc., of the first substrate 110, the color filter unit 120, the low refractive index layer 130, the porous structure 150, the light conversion unit 160 and the protective layer 180, and details thereof are not repeated.

Moreover, the isolating layer 740 is substantially similar to the isolating layer 140 described in the aforementioned embodiment, but a thickness T740 of the isolating layer 740 of the embodiment is greater than the thickness T150 of the porous structure 150. In addition, the light-emitting unit 720 is disposed on the second substrate 710, and the second substrate 710 may be attached to the first substrate 110 through the adhesive layer 730. The adhesive layer 730 may be disposed in a space between the light-emitting unit 720 and the second substrate 710 and/or a space between the light-emitting unit 720 and the protective layer 180.

As shown in FIG. 7, the color filter unit 120, the low refractive index layer 130, the porous structure 150, the light conversion unit 160, and the protective layer 180 are disposed on the first substrate 110, and the thickness T740 of the isolating layer 740 is greater than the thickness T150 of the porous structure 150. In other words, the isolating layer 740 protrudes toward the second substrate 710 with respect to the porous structure 150. A material of the isolating layer 740 may be similar to that of the isolating layer 140 described in the aforementioned embodiment. Therefore, the isolating layer 740 may reduce light penetration or may selectively reflect light. In this way, the isolating layer 740 may mitigate interference of the light emitted from the adjacent light-emitting units 720. In addition, in the embodiment, the light-emitting properties and/or optical characteristics of the light conversion unit 160, the color filter pattern 122, and the light-emitting unit 720 may be as that described in the aforementioned embodiments, so that the a light-emitting effect of the electronic device 700 may be improved.

In summary, in the electronic device of the disclosure, the light conversion unit is dispersed in the pores of the porous structure. Therefore, dispersity of the light conversion unit may be improved, which helps improving the light conversion effect or the quality of the electronic device. In addition, by forming the porous structure in the electronic device to adsorb the light conversion material, it is unnecessary to adjust or change the raw materials of a solvent in order to produce the light conversion unit, thereby mitigating the problem of uneasy producing of the conventional light conversion material.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents. Also, the features may be replaced, rearranged, or combined among the embodiments provided that they do not depart from the spirit of the disclosure or result in conflict.

What is claimed is:

1. An electronic device, comprising:
   a first substrate;
   an isolating layer, disposed on the first substrate, and having an opening;
   a porous structure, disposed in the opening, and having a plurality of pores arranged irregularly; and
   a light conversion unit, disposed in the porous structure.

2. The electronic device as claimed in claim 1, wherein a thickness of the porous structure is greater than or equal to 1 μm and less than or equal to 100 μm.

3. The electronic device as claimed in claim 1, further comprising a color filter unit disposed between the first substrate and the porous structure.

4. The electronic device as claimed in claim 3, further comprising a low refractive index layer disposed between the color filter unit and the porous structure.

5. The electronic device as claimed in claim 4, comprising a second substrate and a light-emitting unit, wherein the light-emitting unit is disposed on the second substrate, and the first substrate is attached to the second substrate.

6. The electronic device as claimed in claim 4, wherein a side surface and a top surface of the isolating layer are covered by the low refractive index layer.

7. The electronic device as claimed in claim 1, further comprising a protective layer disposed on the porous structure.

8. The electronic device as claimed in claim 1, comprising a light-emitting unit disposed in the opening.

9. The electronic device as claimed in claim 8, wherein the porous structure contacts at least a part of a side surface of the light-emitting unit.

10. The electronic device as claimed in claim 8, further comprising a spacing layer, wherein the spacing layer is disposed on the first substrate and the isolating layer is disposed on the spacing layer.

11. The electronic device as claimed in claim 10, wherein the light-emitting unit is located in a containing region encircled by the spacing layer.

12. The electronic device as claimed in claim 10, wherein the porous structure is disposed between the light-emitting unit and the spacing layer.

13. The electronic device as claimed in claim 1, wherein the light conversion unit comprises a plurality of quantum dot particles.

14. The electronic device as claimed in claim 1, wherein a pore size of the pores of the porous structure is 0.05 μm to 10 μm.

15. The electronic device as claimed in claim 1, wherein a porosity of the porous structure is 20% to 80%.

16. An electronic device, comprising:
   a substrate;
   a light conversion layer, disposed on the substrate, and comprising a porous structure and a light conversion unit, wherein the porous structure has a plurality of pores arranged irregularly, and the light conversion unit is dispersed in the pores; and
   a light-emitting unit, disposed between the light conversion layer and the substrate.

17. The electronic device as claimed in claim 16, wherein the porous structure contacts at least a part of a side surface of the light-emitting unit.

18. The electronic device as claimed in claim 16, wherein the light conversion unit comprises a plurality of quantum dot particles.

19. The electronic device as claimed in claim 16, wherein a pore size of the pores of the porous structure is 0.05 μm to 10 μm.

20. The electronic device as claimed in claim 16, wherein a porosity of the porous structure is 20% to 80%.

* * * * *